United States Patent [19]

Wong

[11] Patent Number: 5,425,845
[45] Date of Patent: Jun. 20, 1995

[54] METHOD FOR SELECTIVE REMOVAL OF HARD TRENCH MASKS

[75] Inventor: Man Wong, Hong Kong, Hong Kong

[73] Assignee: Texas Instruments Incorporated, Dallas, Tex.

[21] Appl. No.: 75,086

[22] Filed: Jun. 9, 1993

[51] Int. Cl.[6] ............................................. B44C 1/22
[52] U.S. Cl. ................................ 156/646.1; 437/67; 437/72; 437/78
[58] Field of Search .................. 156/646, 662; 437/67, 437/72, 78

[56] References Cited

U.S. PATENT DOCUMENTS

| | | | |
|---|---|---|---|
| 5,047,815 | 9/1991 | Yasuhira | 357/23.6 |
| 5,173,152 | 12/1992 | Tanaka | 156/646 |
| 5,231,046 | 7/1993 | Tasaka | 437/67 |

OTHER PUBLICATIONS

S. Wolf and R. N. Tauber, "Silicon Processing for the VLSI Era" vol. 1-Process Technology, Lattice Press, 1986, pp. 523-527 and 567.

B. E.Deal, M. A. McNeilly, D. B. Kao and J. M. deLarios, "Vapor-Phase Wafer Cleaning, Oxide Etching and Thin Film Growth", Presented at 1st Intl. Symposium on Cleaning Technology in Semiconductor Device Mfg. Fall Meeting, The Electrochem. Soc. in Hollywood, Fla. Oct./1989.

Man Wong, M. M. Moslehi and R. A. Bowling, "Wafer Temperature Dependence of the Vapor-Phase HF Oxide Etch", *J. Electrochem. Soc.*, vol. 140, No. 1, pp. 205-208, Jan. 1990.

M. Wong, M. M. Moslehi and D. W. Reed, "Characterization of Wafer Cleaning and Oxide Etching Using Vapor-Phase Hydrogen Flouride", *J. Electrochem. Soc.*, vol. 136, No. 6, pp. 1799-1802, Jun. 1991.

M. Wong, D. K. Y. Liu, M. M. Moslehi and D. W. Reed, "Preoxidation Treatment Using HCl/HF Vapor", *IEEE Electron Device Letters*, vol. 12, No. 8, pp. 425, 426, Aug. 1991.

Primary Examiner—R. Bruce Breneman
Assistant Examiner—Joni Y. Chang
Attorney, Agent, or Firm—Jacquleine J. Garner; Richard L. Donaldson; William E. Hiller

[57] ABSTRACT

After trench formation on a semiconductor wafer (14) using a hard trench mask containing a phosphosilicate glass top layer and an underlying thermal oxide layer, the phosphosilicate glass layer may be removed without substantially etching the thermal oxide layer. The wafer temperature is increased to at least 40° C. (36) prior to etching with an HF/H$_2$O vapor (40-44).

18 Claims, 2 Drawing Sheets

METHOD FOR SELECTIVE REMOVAL OF HARD TRENCH MASKS

TECHNICAL FIELD OF THE INVENTION

This invention relates in general to the field of semiconductor wafer processing. More particularly, the present invention relates to a method for selective removal of hard trench masks.

BACKGROUND OF THE INVENTION

In certain trench formation processes in semiconductor fabrication, a phosphosilicate glass/nitride/thermal oxide stack is used as a hard mask for trench etching. After trench formation, only the topmost layer of the trench mask, or the phosphosilicate glass (PSG), should be subsequently stripped by diluted hydrofluoric acid (HF) without damaging the underlying nitride and thermal oxide layers. However, the wet phosphosilicate glass strip also etches and causes undercutting of the thermal oxide. The resulting undercut structure of the thermal oxide may cause or aggravate certain leakage mechanisms in the fabricated semiconductor device. Such leakage phenomena are undesirable and need to be eliminated or greatly reduced. Additional applications include the selective removal of phosphosilicate glass or borophosphosilicate glass (BPSG) from a patterned stack which also contain thermal oxide and/or other similar oxide compositions, such as plasma and non-plasma chemical vapor deposited oxides (CVD), doped and undoped oxides, native oxides, and chemical oxides.

SUMMARY OF THE INVENTION

In accordance with the present invention, a method for hard trench mask removal is provided. The method for removing hard trench masks eliminates or substantially reduces the amount of thermal oxide undercutting during removal of the phosphosilicate glass after trench formation. Additionally, wafer fabrication is greatly facilitated since the hard trench removal process is far less dependent on the duration of the etch.

In one aspect of the present invention, a method for removing a hard trench mask after trench formation on a wafer is provided. The wafer temperature is raised to a predetermined setting prior to generating an $HF/H_2O$ vapor. The wafer is then exposed to the $HF/H_2O$ vapor.

In another aspect of the present invention, a method for etching a phosphosilicate glass formation from a structure containing an oxide formation is provided. The temperature of the structure is raised to at least 40° C. An etchant vapor is then generated and allowed to pass over the structure.

In yet another aspect of the present invention, after trench formation on a semiconductor wafer using a hard trench mask containing a phosphosilicate glass top layer and an underlying thermal oxide layer, the phosphosilicate glass layer may be removed without substantially etching the thermal oxide layer. The wafer temperature is increased to at least 40° C. prior to etching with an $HF/H_2O$ vapor.

BRIEF DESCRIPTION OF THE DRAWINGS

For a better understanding of the present invention, reference may be made to the accompanying drawings, in which.

DETAILED DESCRIPTION OF THE INVENTION

Figure 1:
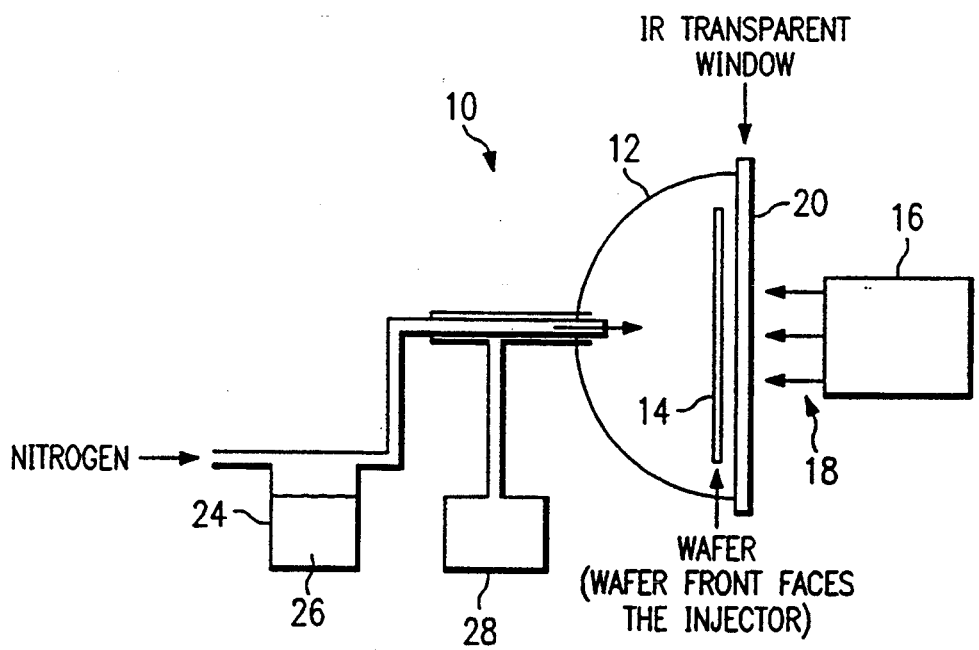
FIG. 1 is a simplified schematic block diagram of a vapor-phase wafer processing reactor.

With reference to the drawings, FIG. 1 illustrates a simplified schematic block diagram of a single-wafer reactor 10. The reactor 10 may be of silicon carbide composite construction which is inert to most process gases. The reactor 10 may be configured as a rapid thermal processing (RTP) automated vacuum processor (AVP) reactor. The reactor 10 has a hemispherical reaction chamber 12 where a wafer 14 is shown positioned therein.

The reactor 10 includes a heating system 16, typically consisting of several heating elements or heating lamps (not shown) arranged to generate and direct infrared radiation 18 onto the wafer 14. The infrared radiation 18 may be used to rapidly heat the wafer 14 to a desired temperature. The heating system 16 may also be of a special low mass, resistance heater designed for this purpose. To maintain chamber vacuum and to avoid contaminating the reaction chamber 12, a quartz window 20 is situated between the heating system 16 and the wafer 14. A vaporizer 24 may be used to generate the $HF/H_2O$ (or HF in $H_2O$) etchant vapor by passing a controlled amount of nitrogen carrier gas over an azeotropic mixture of $HF/H_2O$ 26 heated to a specified temperature, such as 50° C. Other methods for generating the $HF/H_2O$ vapor exists, for example, by extracting pure gaseous HF and mixing it with steam. The $HF/H_2O$ vapor may be injected into the reactor chamber 12 for oxide etching and removal, and be subsequently evacuated by a pump 28.

During semiconductor processing, it may become desirable to form trench features on the face of the wafer. In certain trench formation processes, a phosphosilicate glass/nitride/thermal oxide stack (not shown) is used as a hard mask for trench etching. Phosphosilicate glass, commonly called PSG, forms the topmost layer of the hard trench mask. After trench etching, the phosphosilicate glass layer must be subsequently removed without substantially damaging or undercutting the underlying nitride and thermal oxide layers. Additionally, circumstances may arise for selective removal of phosphosilicate glass or borophosphosilicate glass (BPSG) from a patterned stack also containing thermal oxide and/or other similar oxide compositions, such as plasma and nonplasma chemical vapor deposited oxides, doped and undoped oxides, native oxides, and chemical oxides. The processing recipe may require minor modifications according to the empirical data on the property of these other oxide materials.

Figure 3:
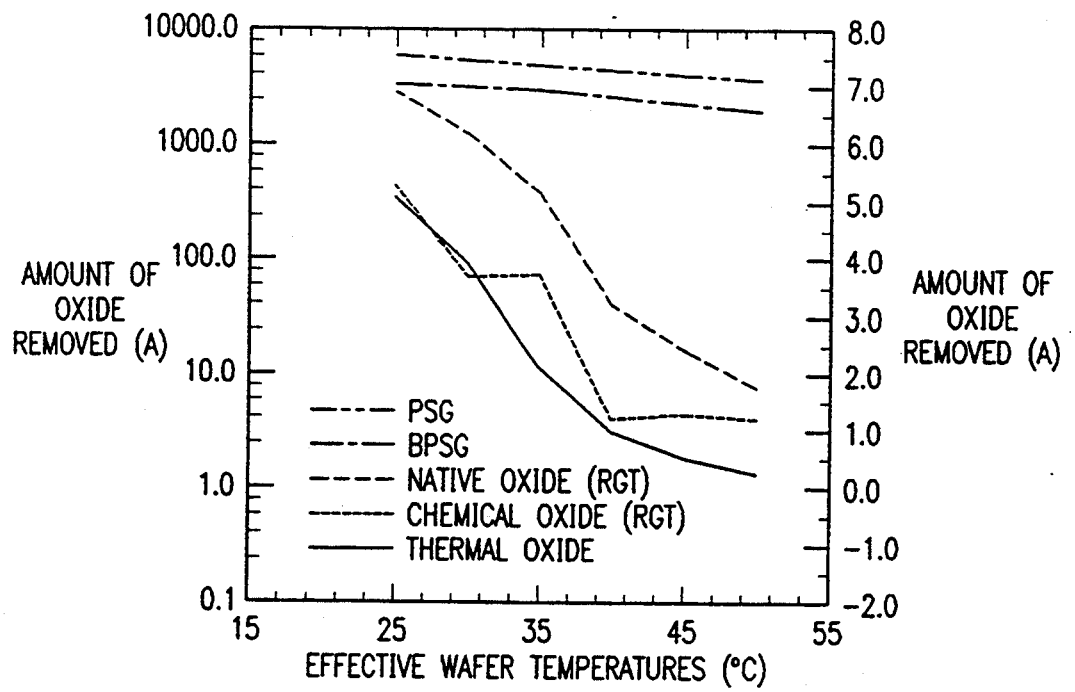
FIG. 3 is a plot illustrating the effect of wafer temperature on the amount of oxide removed.
Figure 4:
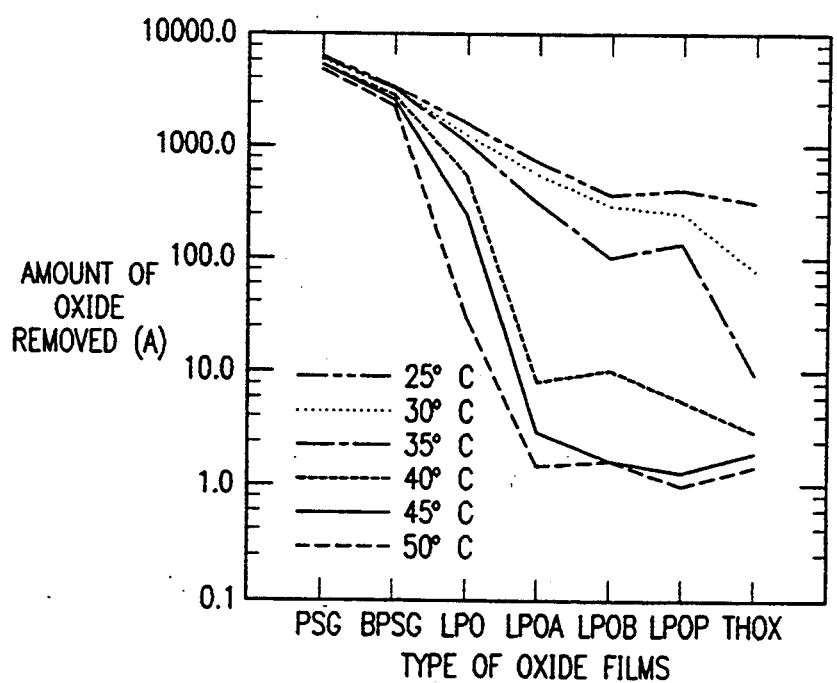
FIG. 4 is a plot comparing the amount of oxide removed for a number of materials.

A method has been devised which eliminates or greatly reduces such undercutting of the thermal oxide during phosphosilicate glass removal after trench etching. Referring to the flowchart shown in FIG. 2, the method for removing hard trench masks is illustrated. At the start of the method, as shown by block 34, the trench (not shown) has already been formed, and the wafer 14 is positioned in the reactor chamber 12, such as shown in FIG. 1. The wafer temperature is then raised to a specified temperature, as shown in block 36. The wafer 14 may be heated by the infrared radiation from the heating system 16 to the specified temperature. The specified temperature has been shown empirically to be 40° C. or greater for minimal thermal oxide undercutting. In particular, best results are achieved when the wafer temperature is approximately between 45° C. to 50° C. Empirical data have been plotted and are shown in FIGS. 3 and 4, and are discussed in detail below.

In block 38, the reactor chamber pressure is adjusted to a predetermined setting. It has been determined that reactor chamber pressure ranging from 1 to 550 torr is adequate for the present application. The chamber pressure in addition to the speed at which the $HF/H_2O$ vapor passes through the chamber 12 determine the uniformity and rate of etch, and may therefore be adjusted accordingly.

Referring to block 40, the $HF/H_2O$ vapor is generated. As described above, the $HF/H_2O$ vapor may be generated a number of ways, one of which is by passing an inert carrier gas at a predetermined rate over a heated $HF/H_2O$ azeotropic solution. In particular, pure gaseous nitrogen may be injected into the system at the rate of approximately ten liters per minute, and the carrier gas may flow over the $HF/H_2O$ solution at the rate of approximately five liters per minute, giving rise to a total flow rate through the reactor chamber 12 of approximately fifteen liters per minute.

As the $HF/H_2O$ vapor passes into the reaction chamber 12, the top surface of the wafer 14 becomes exposed to the vapor, as shown in block 42. Initially, an incubation period takes place during which no perceptible etching occurs. During the incubation period, a thin aqueous film of HF and $H_2O$ condenses on the surfaces of the wafer 14. The increased wafer temperature prolongs the incubation period of the thermal oxide in addition to reducing its etch rates. Whereas the etch duration was ten seconds or less, the etch duration may now be as long as forty to fifty seconds. The etch duration need not be controlled exactly and still achieve excellent etch results. The hard trench mask removal process is thus far less dependent on the duration of the etch, which facilitates control of the wafer fabrication process.

Progressing to block 44, it is determined whether the etch has been completed. Completion depends on whether the desired etch uniformity has been achieved, or whether all of the phosphosilicate glass has been removed. If the etch is not finished, then a second over-etch step follows. Assuming the wafer temperature is still at the desired predetermined setting, and the chamber pressure remained constant, additional $HF/H_2O$ vapor is produced and allowed to flow through the chamber 12. In particular, the flow rate of the carrier gas may be reduced to approximately one liter per minute, but the amount of pure nitrogen gas is correspondingly increased to approximately fourteen liters per minute to maintain the total flow rate through the chamber 12 at approximately fifteen liters per minute. At the end of the over-etch step, the hard trench mask removal is achieved, as shown in block 46.

Figure 2:
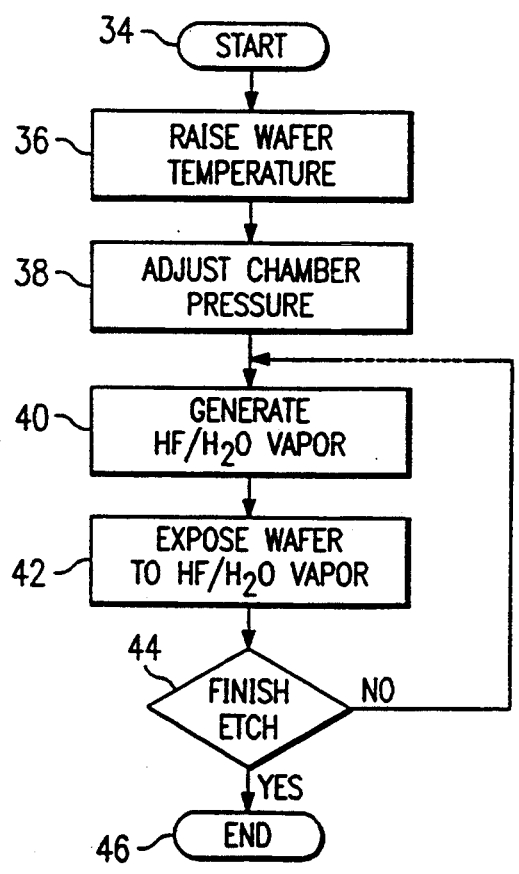
FIG. 2 is a simplified flowchart of the method steps.

Following the steps shown in FIG. 2, other wafer processing steps may be required. These include injecting pure nitrogen gas to evacuate the chamber 12 of $HF/H_2O$ vapor, rinsing and cleaning the wafer 14, modifying the chamber pressure, and reducing the wafer temperature, etc.

The prescribed parameters provide good throughput while minimizing thermal oxide undercutting. However, the parameters as set forth above serve merely as processing guidelines and may be modified according to empirical data, the specific materials involved, and other relevant factors.

Referring to FIG. 3, a plot of the amount of material removed versus wafer temperatures is shown for a number of materials including phosphosilicate glass, borophosphosilicate glass, native oxide, chemical oxide, and thermal oxide. The error bars indicate the one standard deviation etch nonuniformities. The plot shows that, as the wafer temperature is increased from 25° C. to 50° C., the amount of phosphosilicate glass and borophosphosilicate glass removed is generally independent of wafer temperature and only decreases slightly (as indicated by the scale on the left vertical axis). On the other hand, the amount of thermal oxide etched drops by more than two orders of magnitude when the temperature is raised from room temperature to 40° C. Above 40° C., the etching of thermal oxide essentially ceases. Both native and chemical oxides also show decreasing trends (as shown in dotted lines by the scale on the right vertical axis) with increasing temperature. Therefore, the plot indicates that when the wafer temperature is increased to at least 40° C., the selectivity of etching between thermal oxide and phosphosilicate glass increases to, theoretically, infinity.

Referring to FIG. 4, a plot showing a comparison of the amount of various oxides removed at varying temperatures is shown. Along the vertical axis is the amount of oxide removed, and along the horizontal axis are various types of oxide films. The acronym LPO refers to oxide deposited by low pressure chemical vapor deposition (LPCVD); LPOA refers to annealed LPCVD oxide; LPOB refers to boron ion-implanted and annealed LPCVD oxide; LPOP refers to arsenic and phosphorous ion-implanted and annealed LPCVD oxide; and THOX refers to thermal oxide. The error bars indicate the one standard deviation etch nonuniformities. From FIG. 4, it can be seen that phosphosilicate glass and thermal oxide occupy the low and high ends of the wafer temperature sensitivity spectrum, respectively.

Accordingly, the theoretically infinite selectivity between etching phosoposilicate glass and thermal oxide due to increased wafer temperature is utilized. The phosphosilicate glass structure occupying the topmost or outermost position in a patterned formation may be etched away uniformly without damaging underlying oxide structures. Further, the etch process has become far less dependent on time and requires less stringent control of etch duration.

Although the present invention has been described in detail, it should be understood that various changes, substitutions and alterations can be made thereto without departing from the spirit and scope of the present invention as defined by the appended claims.

What is claimed is:

1. A method for removing a hard trench mask having a glass top layer with an underlying oxide layer after trench formation on a wafer, comprising the steps of:
   raising the temperature of the wafer;
   generating an $HF/H_2O$ vapor; and
   exposing the wafer to said generated $HF/H_2O$ vapor for a duration greater than 10 seconds to remove said glass top layer leaving said underlying oxide layer.

2. The method, as set forth in claim 1, wherein said wafer temperature raising step includes the step of raising the wafer temperature up to 50° C.

3. The method, as set forth in claim 1, wherein said wafer temperature raising step includes the step of raising the wafer temperature to at least 40° C.

4. The method, as set forth in claim 1, further comprising the steps of:
enclosing the wafer within a reactor chamber; and
decreasing the reactor chamber pressure.

5. The method, as set forth in claim 1, wherein said $HF/H_2O$ vapor generating step comprises the step of passing an inert carrier gas over an azeotropic solution of $HF/H_2O$.

6. The method, as set forth in claim 1, wherein said $HF/H_2O$ vapor generating and exposing steps comprise the steps of:
passing a nitrogen carrier gas at a first rate over a heated azeotropic solution of $HF/H_2O$ for generating an $HF/H_2O$ vapor; and
passing said $HF/H_2O$ vapor over the wafer at a second.

7. The method, as set forth in claim 1, further comprising an over-etching step for achieving uniformity and total removal of said hard trench mask.

8. The method, as set forth in claim 1, wherein said glass ton layer is a phosphosilicate glass top layer.

9. The method, as set forth in claim 1, wherein said glass ton layer is a borophosphosilicate glass top layer.

10. The method, as set forth in claim 1, wherein said underlying oxide layer is an underlying thermal oxide layer.

11. A method for etching a phosphosilicate glass formation from a structure containing an oxide formation, comprising the steps of:

raising the temperature of the structure to greater than 40° C.;
generating an etchant vapor; and
exposing the structure to said generated etchant vapor for a duration greater than that required to remove said phosphosilicate glass formation in order to remove said phosphosilicate .glass formation but not said oxide formation.

12. The method, as set forth in claim 11, wherein said temperature raising step includes the step of raising the structure temperature up to 50° C.

13. The method, as set forth in claim 11, further comprising the steps of:
enclosing the structure within a reactor chamber; and
decreasing the reactor chamber pressure.

14. The method, as set forth in claim 11, wherein said etchant vapor generating step comprises the step of passing an inert carrier gas over an azeotropic solution of $HF/H_2O$ for generating an $HF/H_2O$ vapor.

15. The method, as set forth in claim 11, wherein said etchant vapor generating and exposing steps comprise the steps of:
passing a nitrogen carrier gas at a first rate over a heated azeotropic solution of $HF/H_2O$ for generating an $HF/H_2O$ vapor; and
passing said $HF/H_2O$ vapor over the structure at a second rate.

16. The method, as set forth in claim 11, further comprising an over-etching step for achieving uniformity and total removal of the phosphosilicate glass.

17. The method, as set forth in claim 11, wherein said phosphosilicate glass composes an outermost layer with an underlying thermal oxide layer.

18. The method of claim 1, wherein said step of exposing the wafer to said generated $HF/H_2O$ vapor lasts for a duration in the range of 30 to 50 seconds.

* * * * *